(12) United States Patent
Harris (10) Patent No.: US 12,101,099 B2
(45) Date of Patent: Sep. 24, 2024

(54) DIFFERENTIAL CHARGE SAMPLING CIRCUIT WITH INTEGRATED FARADAY SHIELD

(71) Applicant: Dunmore Circuits, LLC., Austin, TX (US)

(72) Inventor: Larry L. Harris, Austin, TX (US)

(73) Assignee: Dunmore Circuits, LLC., Austin, TX (US)

( * ) Notice: Subject to any disclaimer, the term of this patent is extended or adjusted under 35 U.S.C. 154(b) by 172 days.

(21) Appl. No.: 17/889,002

(22) Filed: Aug. 16, 2022

(65) Prior Publication Data

US 2023/0344440 A1 Oct. 26, 2023

Related U.S. Application Data

(60) Provisional application No. 63/334,251, filed on Apr. 25, 2022.

(51) Int. Cl.
*H03M 1/34* (2006.01)
*H03M 1/12* (2006.01)
*H03M 1/38* (2006.01)

(52) U.S. Cl.
CPC ........... *H03M 1/38* (2013.01); *H03M 1/1245* (2013.01)

(58) Field of Classification Search
CPC .............................. H03M 1/38; H03M 1/1245
USPC .................................. 341/155, 158, 172, 144
See application file for complete search history.

(56) References Cited

U.S. PATENT DOCUMENTS

| | | | |
|---|---|---|---|
| 4,803,462 A | 2/1989 | Hester et al. | |
| 6,400,302 B1 | 6/2002 | Amazeen et al. | |
| 6,456,220 B1 | 9/2002 | Leung et al. | |
| 6,882,298 B2 | 4/2005 | Leung et al. | |
| 7,151,475 B2 | 12/2006 | Boemler | |
| 8,299,837 B1 | 10/2012 | Lin | |
| 10,917,105 B1 * | 2/2021 | Ayman | .................. H03L 7/0812 |

* cited by examiner

*Primary Examiner* — Peguy Jean Pierre
(74) *Attorney, Agent, or Firm* — Egan, Enders & Huston LLP.

(57) ABSTRACT

A sampling capacitor structure, which includes a Faraday Shield that can be switched between various nodes. In a switched capacitor circuit, this sampling capacitor structure allows for differential charging of the sampling capacitor while minimizing the effects of any parasitic stray capacitor. Furthermore, with appropriate switching of the Faraday Shield, once the differential charge sampling circuit samples the differential signal, this sampled differential charge can then be transferred to a downstream single-ended circuit, such as an integrator, without any loss of signal.

19 Claims, 13 Drawing Sheets

DIFFERENTIAL CHARGE SAMPLING CIRCUIT WITH INTEGRATED FARADAY SHIELD

PRIORITY

The present application claims priority to U.S. 63/334,251 filed Apr. 25, 2022. All references cited herein including patents and patent applications, are incorporated by reference.

BACKGROUND

Field of the Invention

This invention relates to a sampling capacitor structure and clocking scheme for a switched capacitor circuit with a differential input signal. This differential input circuit has an electrostatic shield, also known as a Faraday Shield. This Faraday Shield can be switched between nodes of the circuit to minimize the effect of parasitic capacitance. With the appropriate location of the switches in the signal path, the sampled differential signal can be easily interfaced to a single-ended circuit without any loss of dynamic range of the signal. Typically single-ended circuits are smaller in area than a fully differential circuit. Also, Single-ended circuits do not have a common-mode feedback loop which needs to be stabilized.

Background of the Invention

Switched capacitor circuits generally fall into two analog input types. The first type is known as a single-ended input structure. The second type is known as a differential input structure.

Figure 1A:
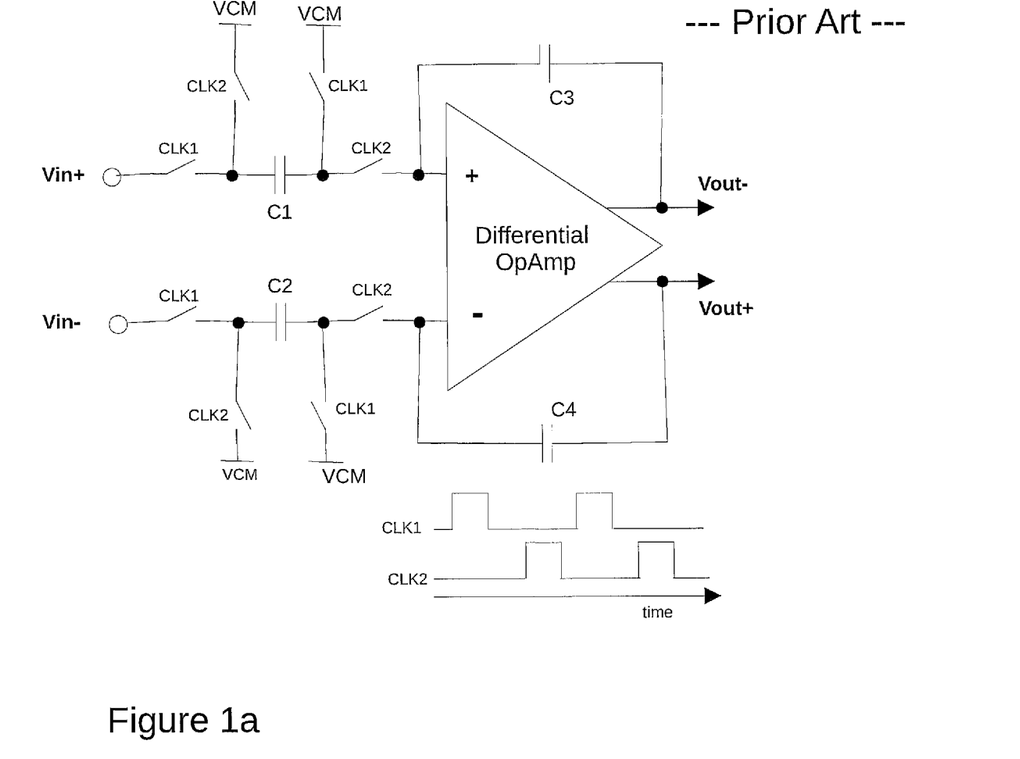
FIG. 1a is a circuit diagrams of a Prior Art, Differential Input Switched-Capacitor Integrator.
Figure 1B:
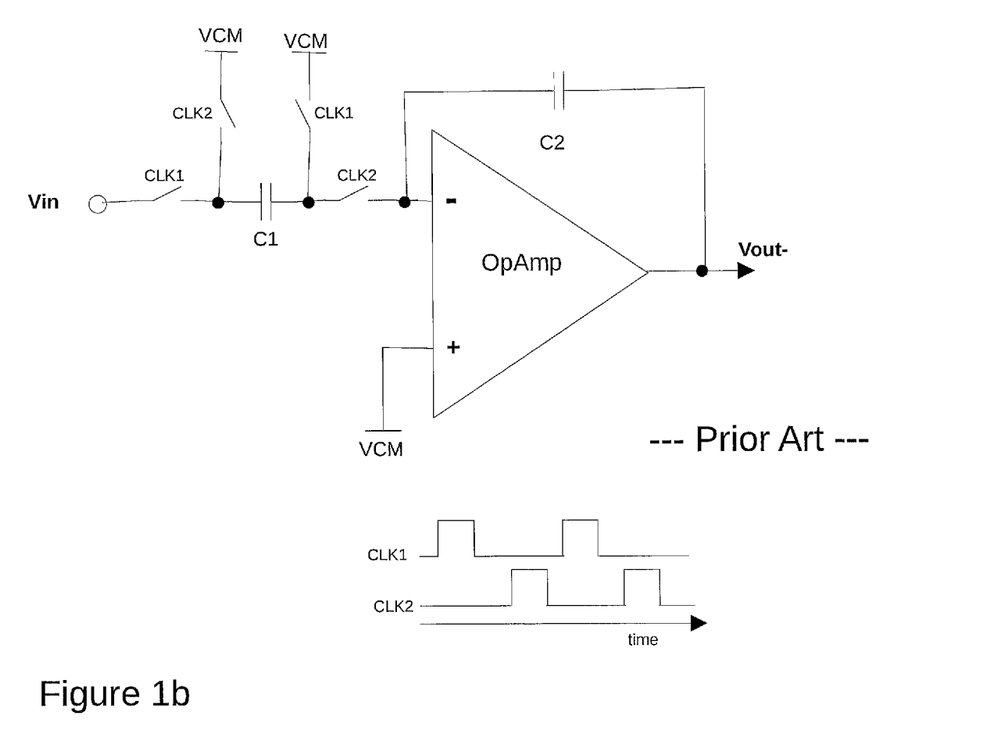
FIG. 1b is a circuit diagrams of a Prior Art, Single-ended Input Switched-Capacitor Integrator.
Figure 1C:
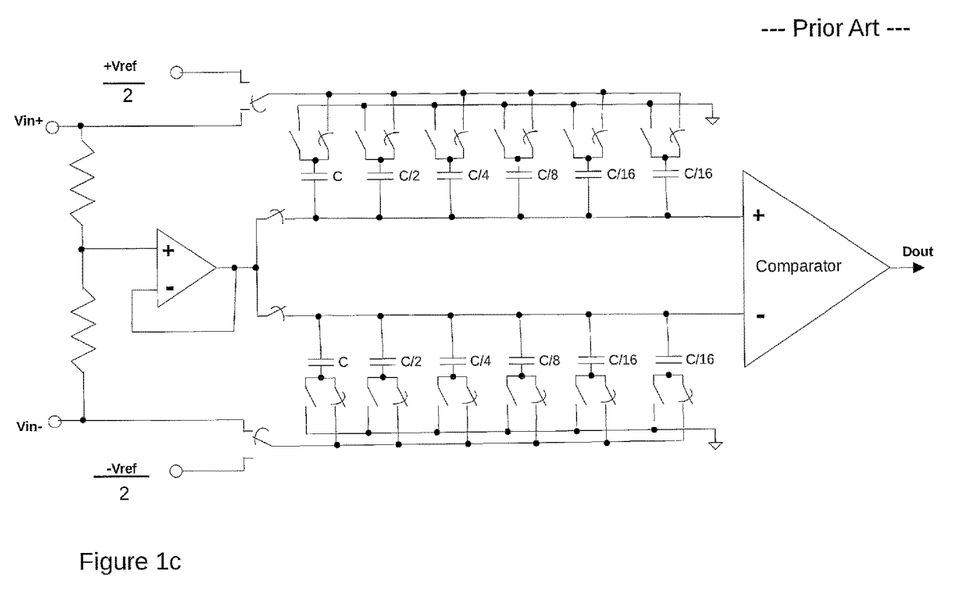
FIG. 1c is a circuit diagram of a Prior Art, Differential Input Switched-Capacitor SAR ADC.
Figure 1D:
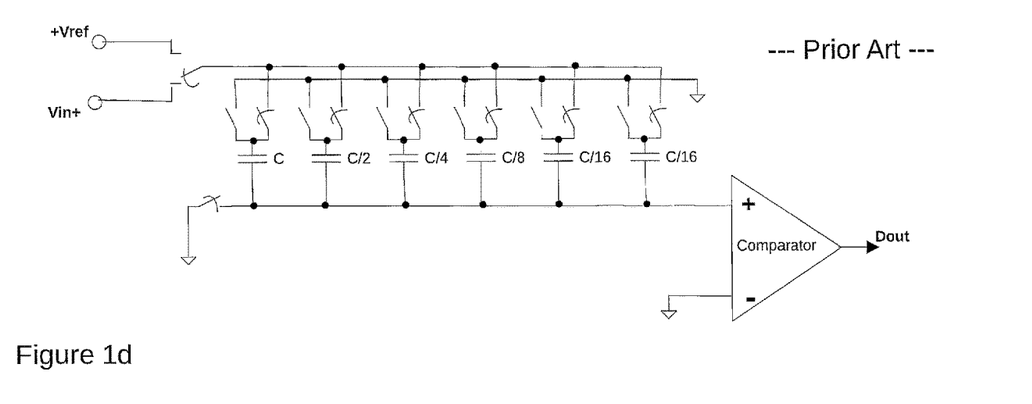
FIG. 1d is a circuit diagrams of a Prior Art, Single-ended Input Switched-Capacitor SAR ADC.

In a single-ended input structure the input signal is referenced to ground of the signal source. FIG. 1b is an example schematic of a prior art single-ended input, switched-capacitor, integrator. FIG. 1d is an example schematic of a prior art single-ended input, switched-capacitor, SAR ADC. One of the advantages of these single-ended input circuits is the relative simplicity of the circuitry that is doing some sort of processing on the signal. The amplifiers used in this signal processing circuit is of the single-ended family of amplifiers which do not have a complex common-mode voltage control feedback loop. One of the disadvantages of the single-ended signal processing circuit is that if the ground of the signal source is at a different voltage potential than the ground of the Switched-Capacitor circuit, this voltage difference in the respective grounds show up as an error signal in the signal processing chain.

In a differential input structure, the input signal is composed of two signals that are 180 degrees output of phase from each other. FIG. 1a is an example of a prior art, differential input, switched-capacitor integrator. FIG. 1c is an example of a prior art, differential input, switched-capacitor SAR ADC. These two input signals are typical called Vin+ and Vin−. These signals are not referenced to the signal source ground and are only referenced to each other. One of the advantages of this type of circuit is very good rejection to any error signal that is common-mode to both input Vin+ and Vin− signals. As an example, one of the common-mode error signal sources arise from the ground difference of the differential signal source and the local signal processing circuits. One of the disadvantages of this type of signal chain is that the circuit components in the signal path is double the number of circuit components over a single-end design doing the same type of signal processing. Another disadvantage is the common-mode voltage control loop's finite signal bandwidth. This loop cannot reject common-mode error signals that are at a higher frequency than the common-mode voltage control loop signal bandwidth.

There is a sub-set of differential input structures typically called Pseudo-Differential Inputs. In these Pseudo-Differential Inputs, one of the differential inputs, typically called Vin−, is tied to the signal source reference ground. This input signal is still composed of two signals where one signal is the signal source reference ground and the other signal is the signal source. This structure still has the advantage of rejecting common-mode error sources.

Figure 2A:
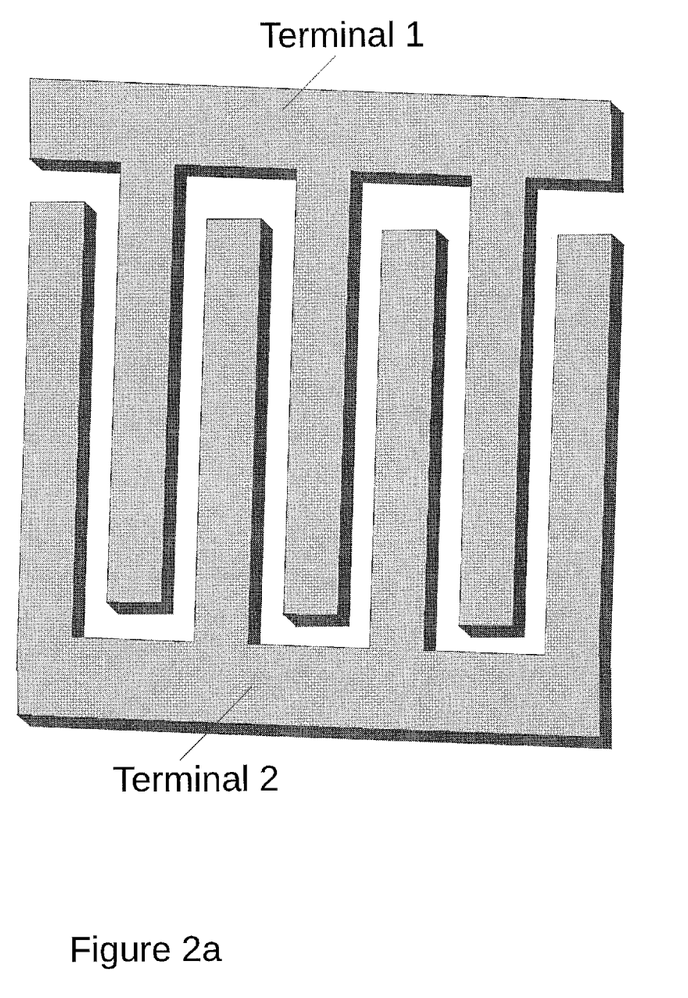
FIG. 2a is a Layout of Single-layer Metal-to-Metal capacitor.
Figure 2B:
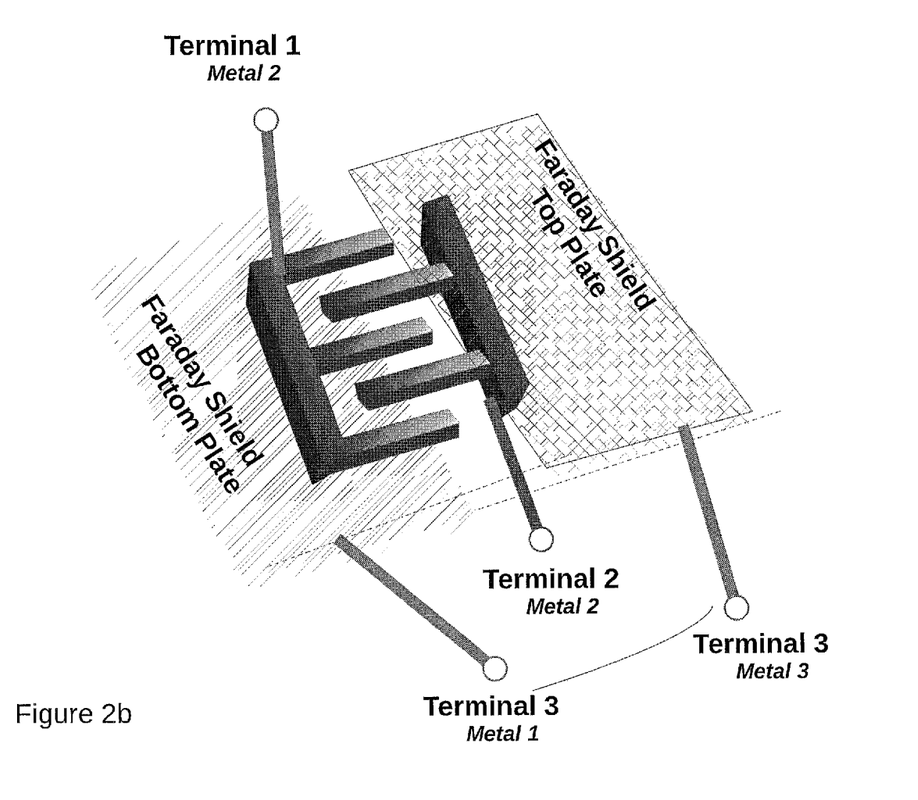
FIG. 2b is a Layout of Single-layer Metal-to-Metal capacitor with Faraday Shield.
Figure 2C:
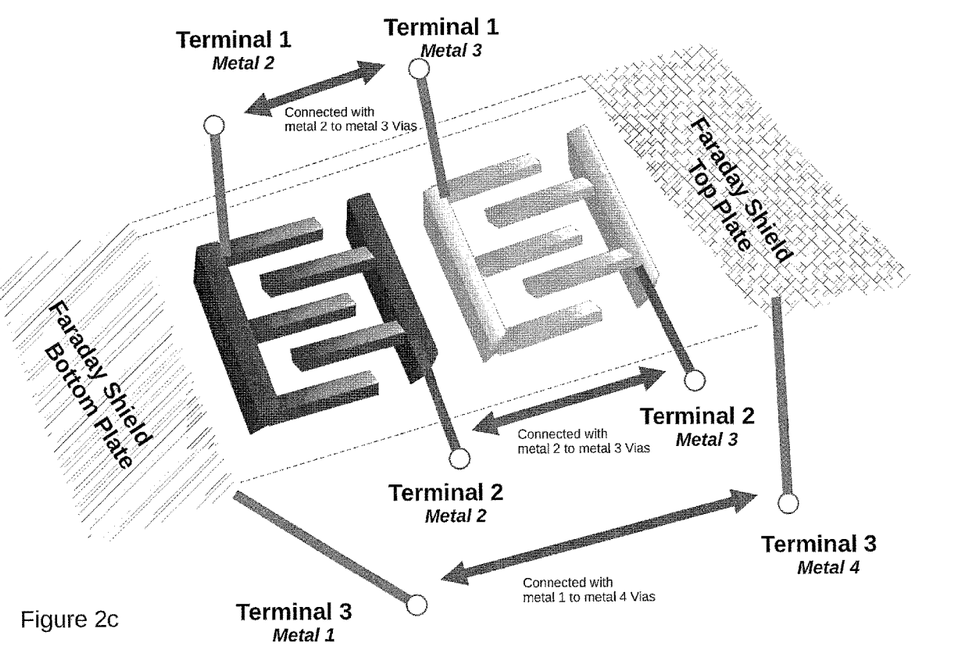
FIG. 2c is a Layout of Two-layer Metal-to-Metal capacitor with Faraday Shield.
Figure 2D:
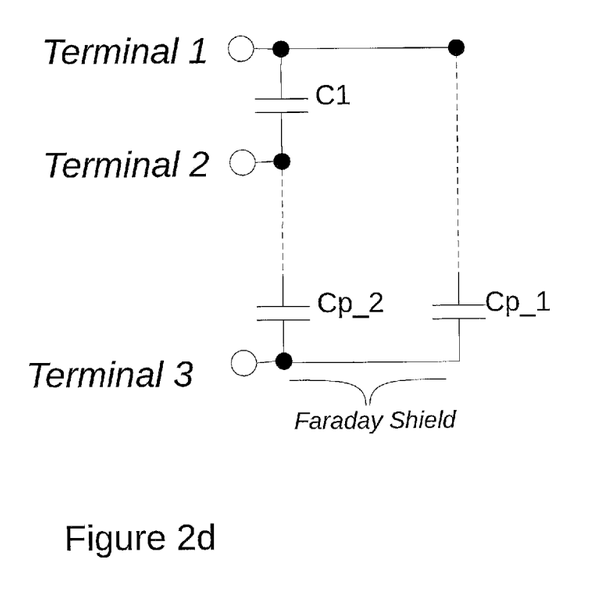
FIG. 2d is a Schematic of Metal to Metal capacitor with Faraday Shield.

Another aspect of this invention relates to Faraday Shielding of circuit components. FIG. 2a shows the layout of a metal-to-metal "side-wall" capacitor without a Faraday Shield. FIGS. 2b and 2c shows the layout of a metal-to-metal "side-wall" capacitor with a "top-plate" Faraday Shield and a "bottom-plate" Faraday Shield. The "top-plate" and "bottom-plate" Faraday Shields are connected together either with switches or some other type of connecting device like VIAs, note that these connections are not shown in FIGS. 2b and 2c. FIG. 2d shows the electrical schematic of the capacitor layout with the Faraday Shield. There are 3 capacitors shown in FIG. 2d, the larger valued "side-wall" capacitor, labeled as C1, is connected between terminal 1 and terminal 2. Also shown in FIG. 2d are the are two smaller valued parasitic capacitors, known as "top-plate" and "bottom-plate" capacitors. The first parasitic capacitor, labeled Cp_1, is connected between terminal 1 and the Faraday Shield. The second parasitic capacitor, labeled Cp_2, is connected between terminal 2 and the Faraday shield. Typically, if a Faraday Shield is used, a shield is connected to the local ground of the signal processing circuitry and is not switched between various nodes. Note that a Faraday Shield, a Faraday Cage, and an Electrostatic Shield are used synonymously herein. Michael Faraday discovered that an electrostatic shield prevents electric fields from one side of the shield from coupling into a circuit that is on the other side of the shield. Many people use the term Faraday Shield in honor of Michael Faraday.

An analogous example of an electrostatic shield is a bottle of water floating in a sea of water. The bottle prevents the sea water from entering into the bottle. Likewise, the water inside the bottle is prevented from escaping into the sea water.

SUMMARY OF THE INVENTION

Broadly speaking, the present application describes a sampling capacitor structure operable in a switched capacitor circuit. The sampling capacitor structure of a preferred embodiment includes a Faraday shield operable for switching between two or more phases; one or more capacitors operable for differential charging; and a charge sampling input phase and a charge transfer output phase, and operable to sample a differential signal. In a preferred form, a sampling capacitor structure in accordance with the present invention is coupled to a single-ended circuit. In an alternate form, the sampling capacitor structure described herein is coupled to a switched capacitor SAR ADC.

Generally, one embodiment of the present invention is a differential input switched-capacitor circuit which also has a Faraday Shield that is also switched between nodes of the circuit. In this embodiment, a differential signal is defined as a pair of signals that are 180 degrees out of phase from each other. For clarity, the first signal will be called Vin+ and the second signal, that is 180 degrees out of phase from Vin+, will be called Vin−.

In one embodiment of the present invention the circuit has two clock phases: a charge sampling input phase, and a charge transfer output phase. Depending upon the circuit application, the charge transfer output phase may be further divided into smaller sub-phases. In conventional applications, a Faraday Shield is driven by a dc signal and not switched between various other signals. In a preferred embodiment of the present invention, during the charge sampling input phase, the Faraday Shield is driven by one side of the differential input pair, noted as Vin−. During the charge transfer output phase, the Faraday Shield is disconnected from Vin− and then connected to a dc bias voltage, typically noted as Vcom, of the switched-capacitor circuit.

DETAILED DESCRIPTION OF THE INVENTION

Figure 3:
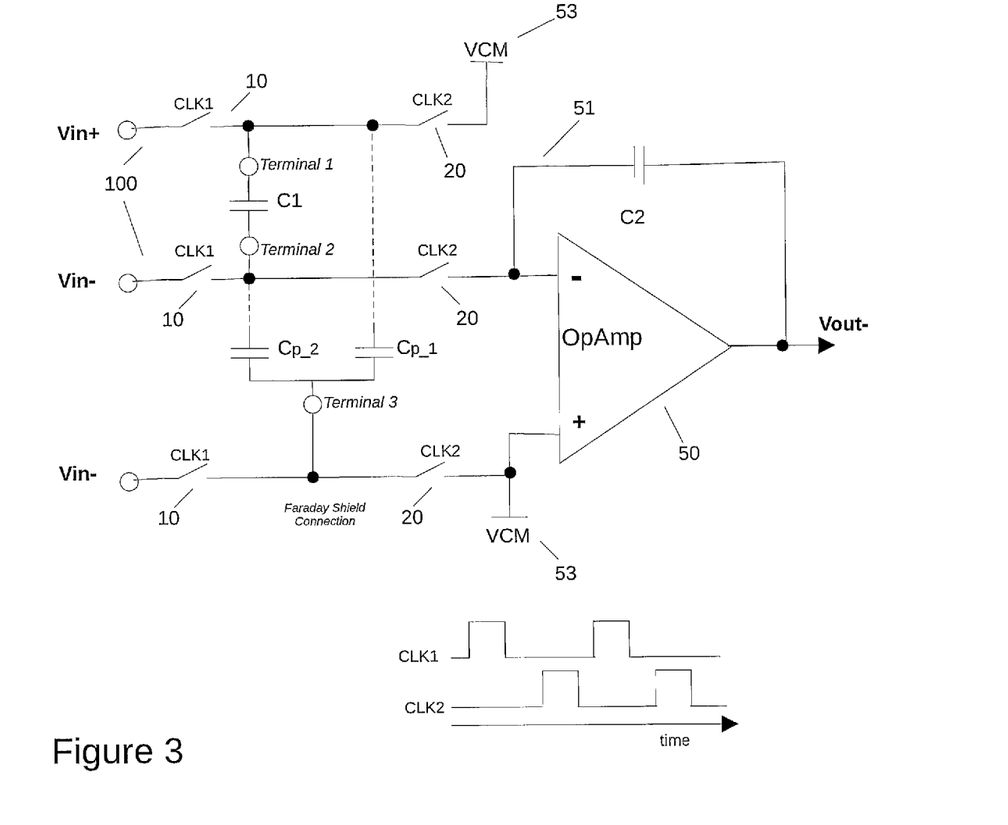
FIG. 3 is a circuit diagram of a Differential Input Switched-Capacitor circuit, with Faraday Shield, driving a Single-ended Integrator.

FIG. 3 illustrates a preferred embodiment of the sampling circuit structure of the present invention driving a single ended integrator. Referring to FIG. 3, when CLK1 is high and CLK2 is low, the switches labeled 10, connect the various capacitors to the input voltages Vin+ and Vin− of the circuit. The Input Signal labeled 100, drives terminals 1 and 2, which puts a charge on capacitor C1 of a value of (Vin+−Vin−)*C1. The Faraday Shield is connected to the Vin− signal which causes parasitic capacitor Cp_1, to be charged to a value of (Vin+−Vin−)*Cp_1. The parasitic capacitor Cp_2 has no charge stored on it because the two sides of capacitor Cp_2 are at the same voltage value of Vin−.

In FIG. 3, When CLK2 is high and CLK1 is low, the switches 20 connect the various capacitors to the switched-capacitor integrator 50 summing junction 51 and to bias voltage labeled Vcom 53. The feedback action of the switched-capacitor integrator 50 causes the summing junction 51 to be driven to a voltage that is the same value as Vcom 53. The capacitor C1 has zero voltage across it and has transferred all the charge that was stored on capacitor C1 to capacitor C2. The integrator capacitor C2 now has the complete differential input charge, (Vin+−Vin−)*C1, stored on it. The parasitic capacitor Cp_1 has both it's terminals connected to bias voltage Vcom 53, and the charge that was stored on Cp_1 is discharged into bias voltage Vcom 53. The parasitic capacitor Cp_2 is connected between the summing junction 51 and the bias voltage Vcom 53. The voltage difference between the summing junction 51 and bias voltage Vcom 53 is zero so there is no charge transfer from Cp_2 into the summing junction 51. This switching of the Faraday Shield allows for the complete sampled charge of the input signal 100 to be transferred to the integrator capacitor C2 without any loss of signal or dynamic range.

Another embodiment in accordance with the present invention is a switched Faraday Shield with a switched-capacitor SAR ADC such as illustrated in FIGS. 4a, 4b, 5, and 6. FIGS. 4a, 4b, 5, and 6 show various charge sampling configurations of a switch-capacitor SAR ADC.

Figure 4A:
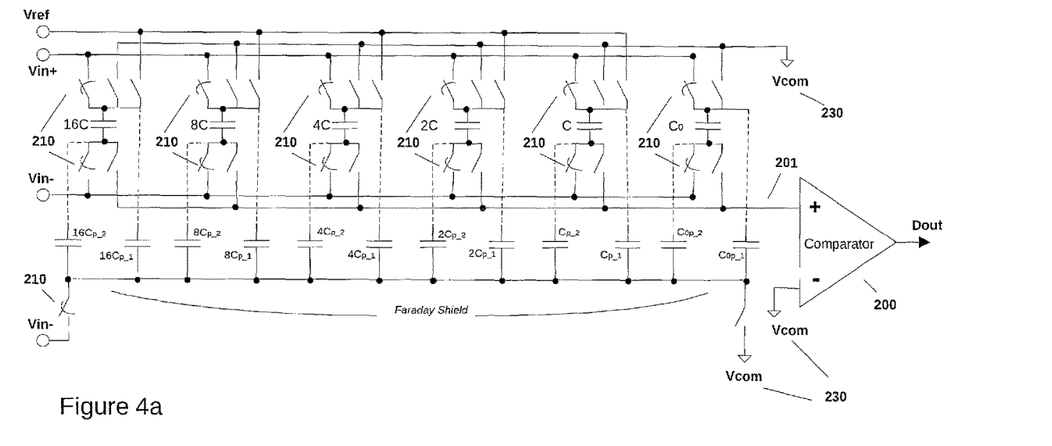
FIG. 4a is a circuit diagram of a SAR ADC Differential Charge Sampling switch configuration.

Referring to FIG. 4a, this is a 5-bit SAR ADC, where the Capacitor Array is connected to the Vin+ and Vin−. Note that in FIG. 4a, the Capacitor Array consist of capacitors 16C, 8C, 4C, 2C, C, and C0. Switches 210 are closed and all other switches are open. This switch configuration is the differential charge sampling mode with capacitors 16C, 8C, 4C, 2C, C, and C0 all connected in parallel. When switches 210 are opened a total charge on the main capacitor array is:

Qtotal=(Vin+−Vin−)*(16C+8C+4C+2C+C+C0).

The charge on the parasitic bottom plate capacitors, 16Cp_2, 8Cp_2, 4Cp_2, 2Cp_2, Cp_2, and C0p_2 is:

Qshield_2=(Vin−−Vin−)*(16Cp_2+8Cp_2+4Cp_2+ 2Cp_2+Cp_2+C0p_2)

The charge on the parasitic plate capacitors, 16Cp_1, 8Cp_1, 4Cp_1, 2Cp_1, Cp_1, and C0p_1 is:

Qshield_1=(Vin+−Vin−)*(16Cp_1+8Cp_1+4Cp_1+ 2Cp_1+Cp_1+C0p_1)

Since (Vin−−Vin−)=0, the charge "Qshield_2" is 0.

Figure 4B:
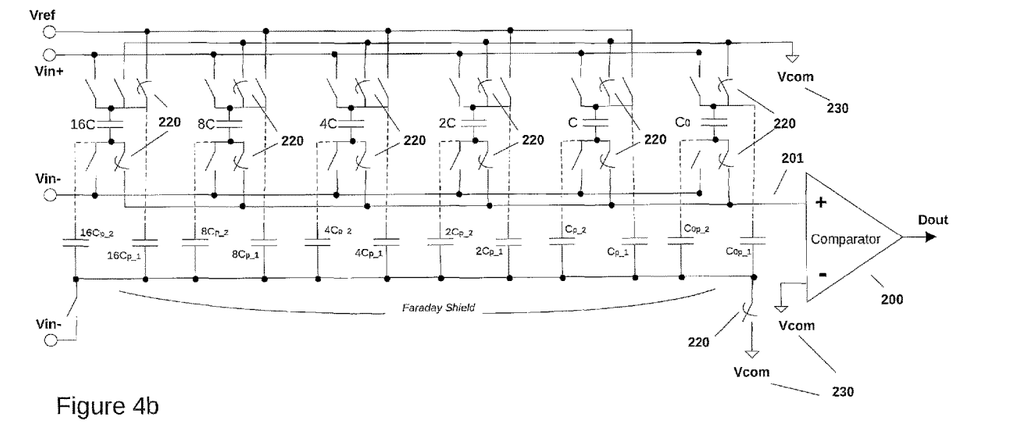
FIG. 4b is a circuit diagram of a SAR ADC Charge Redistribution switch configuration for MSB test.

FIG. 4b illustrates an embodiment with a switch configuration after the charge is sampled onto the Capacitor Array. The switches 220 are closed and the circuit is configured into the charge redistribution mode testing the MSB bit. In this configuration, the bottom plate of the capacitors 16C, 8C, 4C, 2C, C, and C0 are connected to the +Input node 201 of the comparator 200. The parasitic top plate capacitors, 16Cp_1, 8Cp_1, 4Cp_1, 2Cp_1, Cp_1, and C0p_1 are connected between voltage sources and do not connect to the input of the Comparator 201 and do not cause any error to the signal at the +Input node 201 of the comparator 200.

The parasitic bottom plate capacitors, 16_Cp_2, 8Cp_2, 4Cp_2, 2Cp_2, Cp_2, and C0p_2 are connected between voltage source Vcom 230 and the +Input node 201 of the Comparator 200. These parasitic capacitors will contribute a gain error to the signal at the +Input node 201 when the voltage at +Input node 201 is not equal to Vcom 230. When +Input node 201 is at the same voltage as Vcom 230, there is no gain error because there is no voltage across the parasitic bottom plate capacitors.

The SAR control logic, not shown in the Figures, is well known. See e.g. U.S. Pat. Nos. 4,803,462 and 6,400,302 (Incorporated by reference herein). This control logic successively connects the top plate of each capacitor of the main capacitor array, 16C, 8C, 4C, 2C, and C, to Vref one at a time. This SAR control logic is a search algorithm which forces the voltage at the +Input node 201 of the Comparator 200 to servo into the value of Vcom 230. This search algorithm starts by connecting the top plate of capacitor 16C to Vref 231 and the top plates of the capacitors 8C, 4C, 2C, C, and C0 to Vcom 230. If the output the Comparator 200 is high, the top plate of capacitor 16C is disconnected from Vref 231 and connected to Vcom 230. If the output of the Comparator 200 is low, the top plate of capacitor 16C remains connected to Vref 231. Then the SAR search algorithm steps to the next bit, 8C, in the Capacitor Array and repeats the test to determine if that cap should be connected to Vref or Vcom. The SAR search algorithm progresses on with testing the capacitors 4C, 2C, and C, progressively causing the voltage at the input to the +Input node 201 of the Comparator 200 to approach the same voltage value as Vcom 230. Note that capacitor C0 does not participate in the SAR search algorithm in driving the voltage at the +Input node 201. This is due to the fact that there are only $2^N-1$ results for the search algorithm where the total charge sampled is $2^N$.

Figure 5:
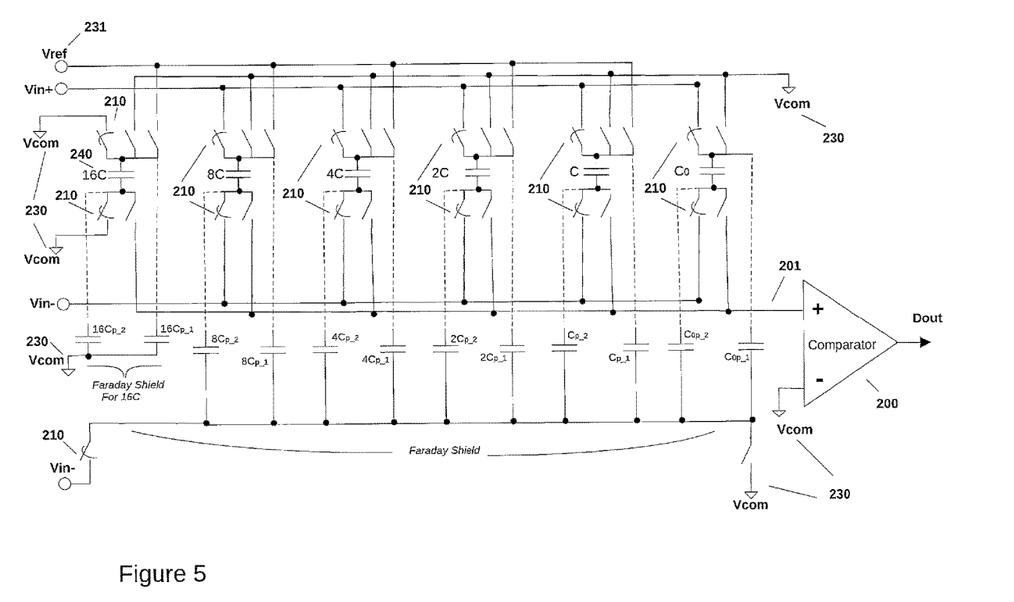
FIG. 5 is a circuit diagram of a Differential Sampling SAR ADC with voltage input range of 0 v to Vref.

FIGS. 4a and 4b show a "Pseudo-Differential Input" ADC with an input range of 0 to Vref/2. FIG. 5 show a "Pseudo-Differential Input" ADC with an input range of 0 to Vref. The only difference in the circuit between the "Pseudo-Differential Input" ADC with an input range of 0 to Vref/2 and a "Pseudo-Differential Input" ADC with an input range of 0 to Vref is how the MSB capacitor, labeled 240, noted as 16C in FIG. 5, and it's Faraday Shield are connected during the input charge sampling phase. During the differential input charge sampling phase switches 210 are closed, both terminals of capacitor 16C are connected to VCOM 230, and all other capacitors, 8C, 4C, 2C, C, and C0, are connected to Vin+ and Vin−. At the end of the input charge sampling phase, the charge stored on capacitor 16C is 0. The charge stored on capacitors 8C, 4C, 2C, C, and C0 is (Vin+−Vin−)*(8C+4C+2C+C+C0) The Charge Redistribution phase is exactly this same as described before for FIG. 4b. Note that in FIG. 5, the Faraday Shield for 16C is hardwired to VCOM 230. The Faraday Shield for 16C can have switches, but in this case they are not needed because the Faraday Shield for 16C would be switched from VCOM 230 to VCOM 230.

Figure 6:
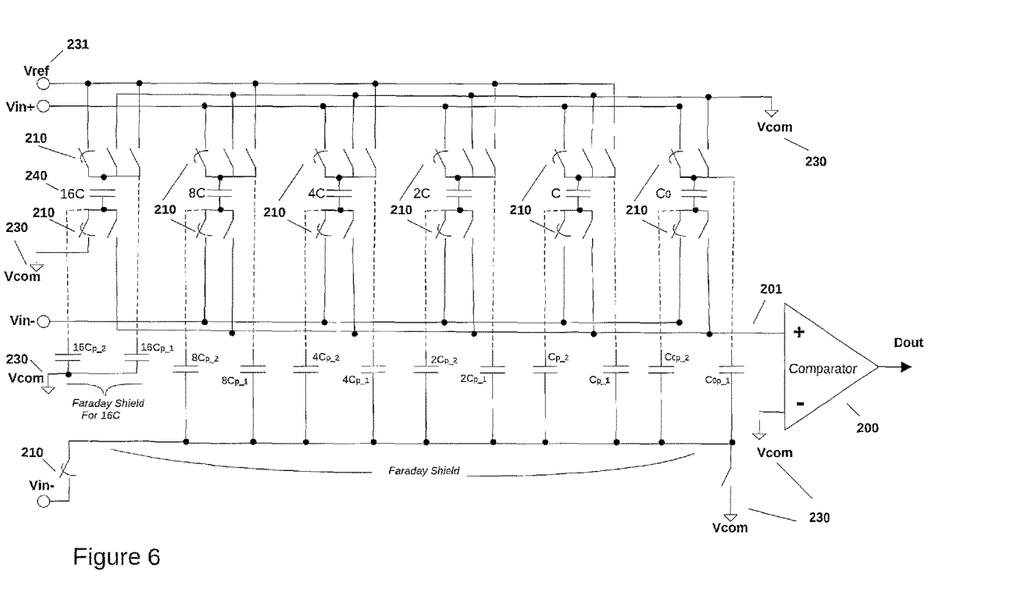
FIG. 6 is a circuit diagram of a Differential Sampling SAR ADC with voltage input range of −Vref/2 to +Vref/2.

FIG. 6 is for a "Fully Differential Input" ADC with a fully differential input range of −Vref/2 to +Vref/2. The only difference between "Psuedo-Differential" input ADC shown in FIG. 5, and the "Fully Differential Input" ADC shown in FIG. 6 is how the MSB capacitor, labeled 240, noted as 16C on FIG. 5 and FIG. 6, is charged during the Input Sampling phase. For the circuit shown in FIG. 5, the MSB capacitor, noted as 16C, has 0 charge stored on it during the input sampling phase. Where as, the circuit shown in FIG. 6, the MSB capacitor, noted as 16C, has a charge of (Vref−Vcom)*16C stored on it. The operation of the Charge Redistribution Phase is exactly the same between the two circuits. As in FIG. 5, the Faraday Shield for 16C can have switches, but in this case they are not needed because the Faraday Shield for 16C would be switched from VCOM 230 to VCOM 230.

What is claimed:

1. A sampling capacitor structure operable in a switched capacitor circuit, the sampling capacitor structure comprising:
    a Faraday shield operable for switching between two or more phases;
    one or more capacitors operable for differential charging; and
    a charge sampling input phase and a charge transfer output phase, and operable to sample a differential signal.

2. The sampling capacitor structure of claim 1, the sampling capacitor structure coupled to a single-ended circuit.

3. The sampling capacitor structure of claim 1, the sampling capacitor structure coupled to a switched capacitor SAR ADC.

4. The sampling capacitor structure of claim 1, operatively coupled to a two clock phase, differential charge sampling capacitor, switch-capacitor integrator comprising:
    on phase 1 of the two clock phases;
    a switch connects terminal 1 of the sampling capacitor structure to one side of the differential input voltage signal;
    a switch connects terminal 2 of the sampling capacitor structure to the other side of the differential input voltage signal; and
    a Faraday Shield is coupled to terminal 3 and a switch connects terminal 3 of the sampling capacitor structure to the same input signal as terminal 2, such that at the end of phase 1, the switches open up, storing a charge on the sampling capacitor structure.

5. The sampling capacitor structure of claim 4, operatively coupled to a two clock phase, differential charge sampling capacitor, switch-capacitor integrator comprising:
    on phase 2 of the two clock phases;
    a switch connects terminal 1 of the sampling capacitor structure to a common-mode bias voltage of the switch-capacitor integrator;
    a switch connects terminal 2 of the sampling capacitor structure to a summing junction of a switch-capacitor integrator; and
    a switch connects terminal 3 (Faraday Shield) of the sampling capacitor structure to a common-mode bias voltage of the switch-capacitor integrator.

6. A switch-capacitor SAR ADC having an array of sampling capacitor structures coupled with a differential input, comprising:
    on an ADC input sampling phase
    a number of capacitors of the array are connected between the differential input voltage nodes of the SAR ADC;
    on an ADC charge redistribution phase
    a Faraday Shield of the capacitors (terminal 3) is connected to the Vcom bias voltage of the SAR ADC.

7. The switch-capacitor SAR ADC of claim 6 having an array of sampling capacitor structures coupled with a differential input,
    on said ADC input sampling phase
    terminal 1 of the capacitors are connect to the Vin+ input voltage node;
    terminal 2 of the capacitors are connected to the Vin− input voltage; and
    the Faraday Shield of the capacitors (terminal 3) are also connected to the Vin− input node of the ADC.

8. The switch-capacitor SAR ADC of claim 7 having an array of sampling capacitor structures coupled with a differential input,
    at the end of the sampling phase, all the terminals of the capacitors are disconnected from the Vin+ and Vin− input voltage nodes.

9. The switch-capacitor SAR ADC of claim 6 having an array of sampling capacitor structures coupled with a differential input,
    on said ADC charge redistribution phase the Vcom bias voltage is connected to the V− input of the SAR ADC comparator, terminal 2 of a number of the capacitors are connected to the V+ input of the SAR ADC comparator input.

10. The switch-capacitor SAR ADC of claim 9 having an array of sampling capacitor structures coupled with a differential input;
    on said ADC charge redistribution phase
    a ADC search algorithm continues with the ADC conversion process by successively connecting terminal 1 of the capacitors either to the Vref voltage or the Vcom voltage in the SAR ADC conversion process.

11. A switch-capacitor SAR ADC having an array of sampling capacitor structures coupled with a differential input comprising:
    on an ADC input sampling phase
    an MSB cap having terminals 1 & 2 tied to Vcom such that there is 0 charge on the MSB capacitor;
    a Faraday shield (terminal 3) of the MSB capacitor, is connected to Vcom;
    terminal 1 of one or more of the remaining capacitors in the SAR ADC are connected to the Vin+ input voltage node of the ADC; and
    terminal 2 of one or more of the remaining capacitors in the SAR ADC are connected to the Vin− input voltage node of the ADC.

12. The switch-capacitor SAR ADC of claim 11 having an array of sampling capacitor structures coupled with a differential input;
    the Faraday Shield (terminal 3) of one or more of the remaining capacitors are also connected to the Vin− input node of the ADC, and
    at the end of the sampling phase, all the terminals of the capacitors are disconnected from the Vin+ and Vin− input voltage nodes.

13. The switch-capacitor SAR ADC of claim 12 having an array of sampling capacitor structures coupled with a differential input,
    on the ADC charge redistribution phase, the Faraday Shield (terminal 3) of one or more of the capacitors, is connected to the Vcom bias voltage of the SAR ADC;
    wherein the Vcom bias voltage is also connected to the V− input of the SAR ADC comparator and terminal 2 of one or more of the capacitors are connected to the V+ input of the SAR ADC comparator input.

14. The switch-capacitor SAR ADC of claim 13 having an array of sampling capacitor structures coupled with a differential input,
    on the ADC charge redistribution phase; and
    a SAR ADC search algorithm continues with an ADC conversion process by successively connecting terminal 1 of the capacitors either to the Vref voltage or the Vcom voltage in the SAR ADC conversion process.

15. A switch-capacitor SAR ADC having an array of sampling capacitor structures coupled with a differential input comprising:
    on an ADC input sampling phase
    an MSB capacitor with terminal 1 is tied to Vref, a terminal 3 tied to Vcom, such that the MSB capacitor has a charge of (Vref−Vcom)*CMSB; and
    terminal 3 of the MSB capacitor is coupled to a Faraday shield and operatively connected to Vcom.

16. The switch-capacitor SAR ADC of claim 15 having an array of sampling capacitor structures coupled with a differential input, comprising:
    terminal 1 of at least some of the capacitors in the capacitor array of the SAR ADC are connected to the Vin+ input voltage nodes of the ADC;
    terminal 2 of at least some of the capacitors in the capacitor array of the SAR ADC are connected to the Vin− input voltage node of the ADC; and
    the Faraday Shield (terminal 3) of at least some of the capacitors in the array are connected to the Vin− input node of the SAR ADC.

17. The switch-capacitor SAR ADC of claim 16 having an array of sampling capacitor structures coupled with a differential input;
    operable such that at the end of the sampling phase, one or more of the terminals of at least some of the capacitors are disconnected from the Vin+ and Vin− input voltage nodes.

18. The switch-capacitor SAR ADC of claim 17 having an array of sampling capacitor structures coupled with a differential input;
    terminal 2 of one or more of the capacitors are connected to the V+ input of the SAR ADC comparator input, the SAR ADC search algorithm performs an ADC conversion process by successively connecting terminal 1 of the capacitors to either the Vref voltage or the Vcom voltage in the SAR ADC conversion process.

19. The switch-capacitor SAR ADC of claim 15 having an array of sampling capacitor structures coupled with a differential input, comprising:
    on an ADC charge redistribution phase
    the Faraday Shield (terminal 3) of one or more of the capacitors is connected to the Vcom bias voltage of the SAR ADC; and
    the Vcom bias voltage is connected to the V− input of the SAR ADC comparator.

* * * * *